(12) United States Patent
Tanibuchi et al.

(10) Patent No.: US 11,824,460 B2
(45) Date of Patent: Nov. 21, 2023

(54) POWER CONVERTER

(71) Applicant: NISSAN MOTOR CO., LTD., Yokohama (JP)

(72) Inventors: Taizo Tanibuchi, Kanagawa (JP); Kazuhiro Hayakawa, Kanagawa (JP); Rei Takahashi, Kanagawa (JP); Hironobu Sugihara, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 17/629,633

(22) PCT Filed: Aug. 24, 2020

(86) PCT No.: PCT/JP2020/031901
§ 371 (c)(1),
(2) Date: Jan. 24, 2022

(87) PCT Pub. No.: WO2022/044093
PCT Pub. Date: Mar. 3, 2022

(65) Prior Publication Data
US 2023/0179109 A1    Jun. 8, 2023

(51) Int. Cl.
*H02M 7/00* (2006.01)
*H02M 7/48* (2007.01)
(Continued)

(52) U.S. Cl.
CPC .............. *H02M 7/003* (2013.01); *H01R 9/24* (2013.01); *H02M 7/48* (2013.01); *H05K 7/209* (2013.01); *H05K 7/2039* (2013.01); *H02M 7/44* (2013.01)

(58) Field of Classification Search
None
See application file for complete search history.

(56) References Cited

U.S. PATENT DOCUMENTS

| | | | | |
|---|---|---|---|---|
| 8,008,805 B2* | 8/2011 | Mizukoshi | ............. | H02K 11/33 307/51 |
| 8,523,604 B2* | 9/2013 | Akuta | ...................... | H01R 9/24 439/502 |

(Continued)

FOREIGN PATENT DOCUMENTS

| | | |
|---|---|---|
| EP | 2 479 845 A1 | 7/2012 |
| JP | 2011-172401 A | 9/2011 |

(Continued)

*Primary Examiner* — Matthew V Nguyen
(74) *Attorney, Agent, or Firm* — Foley & Lardner LLP

(57) ABSTRACT

A power converter includes a power module, a terminal block, a housing that houses the power module and the terminal block, and a bus bar that electrically connects the power module and a conductive member connected to an electric component outside the housing. The terminal block is a member that electrically connects the bus bar and the conductive member, has a first surface, a second surface facing the first surface, and a connection surface that connects the first surface and the second surface, and includes a fastening member provided on the second surface to be movable with respect to the terminal block. The bus bar is formed between the power module and the conductive member to surround the first surface, the connection surface, and the second surface of the terminal block, and is connected to the conductive member on the second surface via the fastening member.

5 Claims, 4 Drawing Sheets

(51) Int. Cl.
   *H05K 7/20*    (2006.01)
   *H01R 9/24*    (2006.01)
   *H02M 7/44*    (2006.01)

(56) References Cited

U.S. PATENT DOCUMENTS

| | | | | |
|---|---|---|---|---|
| 8,693,193 | B2 * | 4/2014 | Ishibashi | H05K 7/209 |
| | | | | 361/689 |
| 9,099,821 | B2 * | 8/2015 | Ikeda | H01M 50/507 |
| 9,831,799 | B2 * | 11/2017 | Shinohara | H02M 7/537 |
| 10,199,804 | B2 * | 2/2019 | Ramm | B60L 1/00 |
| 10,971,914 | B2 * | 4/2021 | Fujimura | H05K 1/0204 |
| 11,290,025 | B2 * | 3/2022 | Aoyagi | H02M 7/5387 |
| 2013/0028001 | A1 * | 1/2013 | Yokota | H02M 7/003 |
| | | | | 363/144 |
| 2013/0128643 | A1 | 5/2013 | Shinohara et al. | |
| 2016/0156278 | A1 | 6/2016 | Ramm et al. | |
| 2019/0297720 | A1 | 9/2019 | Fujimura et al. | |
| 2022/0166347 | A1 * | 5/2022 | Hida | H02M 1/007 |

FOREIGN PATENT DOCUMENTS

| | | | | | |
|---|---|---|---|---|---|
| JP | 2012-5323 | A | | 1/2012 | |
| JP | 2014-17900 | A | | 1/2014 | |
| JP | 2014-036558 | A | | 2/2014 | |
| JP | 2014-222974 | A | | 11/2014 | |
| JP | 2015-153503 | A | | 8/2015 | |
| JP | 2021035235 | | * | 3/2021 | ............ H02M 3/158 |
| WO | WO 2014/020806 | A1 | | 2/2014 | |

* cited by examiner

POWER CONVERTER

TECHNICAL FIELD

The present invention relates to a power converter.

BACKGROUND ART

It is known a power converter having a structure in which a bus bar connected to a power module and a conductive member (power cable) connectable to an external electric component are connected to each other via a terminal block. In such a power converter, the terminal block may be pulled by the conductive member and stress may be concentrated on the terminal block.

JP 2014-17900 A discloses an inverter (power converter) in which a bus bar and a conductive member (power cable) are connected to each other via a nut (fastening member) movable inside a terminal block to reduce stress applied to the terminal block.

SUMMARY OF INVENTION

In the technique described in JP 2014-17900 A, the stress applied to the terminal block can be relaxed. However, the stress may be applied to the bus bar via the conductive member. When the stress is applied to the bus bar via the conductive member, the stress may be applied to a fastening point where the power module and the bus bar are connected to each other.

The present invention has been made in view of the above-mentioned problem, and an object of the present invention is to provide a power converter capable of reducing stress applied to a fastening point between a power module and a bus bar while reducing stress applied to a terminal block connecting the bus bar and a conductive member.

According to an aspect of the present invention, a power converter includes a power module, a terminal block, a housing that houses the power module and the terminal block, and a bus bar that electrically connects the power module and a conductive member connected to an electric component outside the housing. The terminal block is a member that electrically connects the bus bar and the conductive member, has a first surface, a second surface facing the first surface, and a connection surface that connects the first surface and the second surface, and includes a fastening member provided on the second surface to be movable with respect to the terminal block. The bus bar is formed between the power module and the conductive member to surround the first surface, the connection surface, and the second surface of the terminal block, and is connected to the conductive member on the second surface via the fastening member.

DESCRIPTION OF EMBODIMENTS

Hereinafter, an embodiment of the present invention will be described with reference to the drawings and the like.

Figure 1:
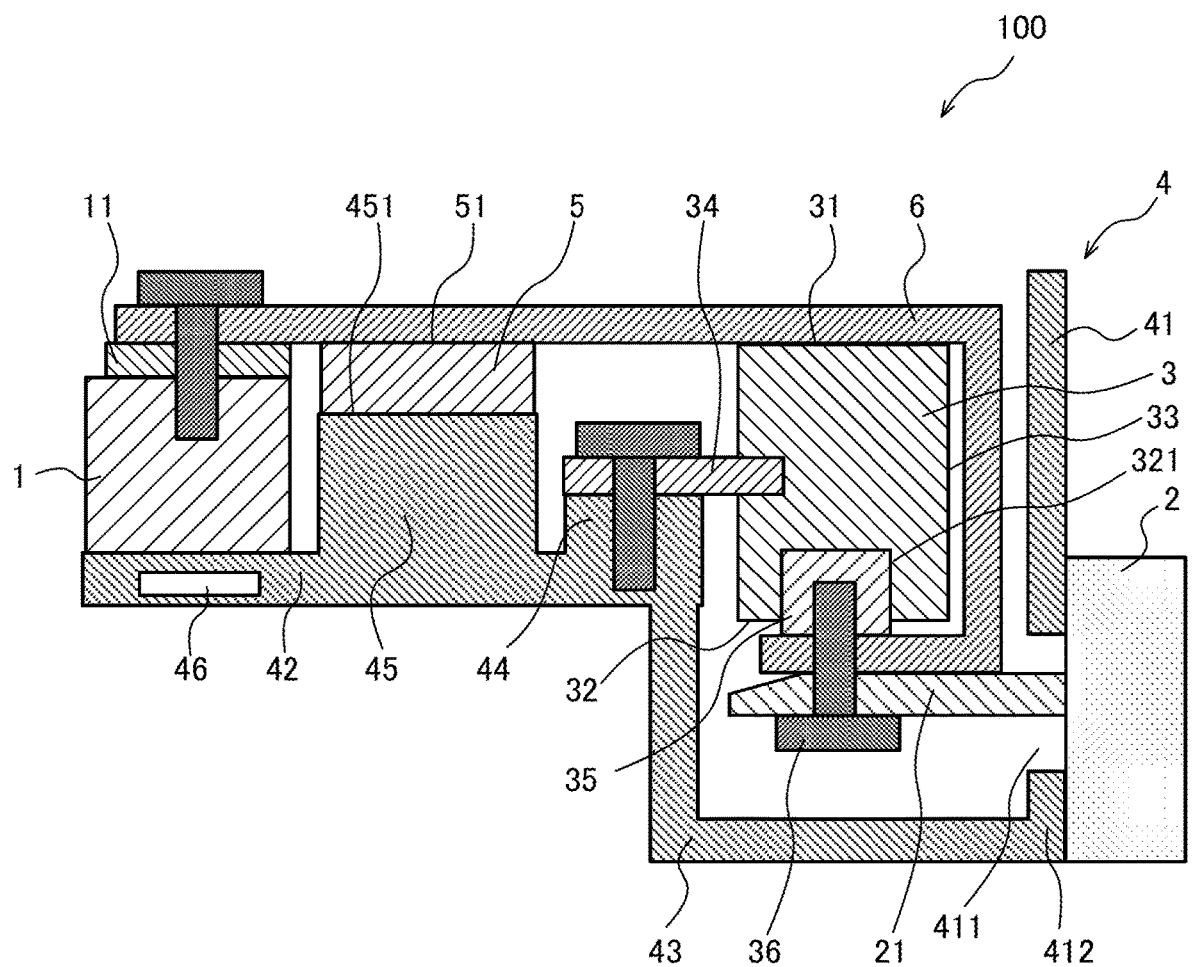
FIG. 1 is a schematic configuration diagram of a power converter according to an embodiment of the present invention.

FIG. 1 is a schematic configuration diagram of an electric power converter 100 according to an embodiment of the present invention. The power converter 100 is, for example, an inverter for a vehicle.

The power converter 100 includes a power module 1, a connector (conductive member) 2, a terminal block 3, a housing 4, a heat transfer sheet (cooling member) 5, a bus bar 6, and the like.

The power module 1 is a circuit having a function of converting electric power into a direct current or an alternating current, and includes a plurality of electric components including semiconductor elements. The power module 1 is housed in the housing 4 and is electrically connected to a power source (not shown) or the like outside the housing 4. Further, the power module 1 includes a connection terminal portion 11, and is electrically connected to one end of the bus bar 6 via the connection terminal portion 11. As will be described later, the other end of the bus bar 6 is electrically connected to the connector 2, which is electrically connected to an electric component outside the power converter 100, in the terminal block 3. In this way, the power module 1 is electrically connected to the electric component outside the power converter 100 via the bus bar 6 and the connector 2.

The connector 2 is a member for electrically connecting the power module 1 and the electric component outside the power converter 100, and is mounted on a side wall 41 of the housing 4 that houses the power module 1 and the terminal block 3. The connector 2 includes connector terminals 21. The connector terminal 21 is one end of a high-power harness (conductive member) electrically connected to a high-power electrical component outside the housing 4 such as a motor, and projects from an opening 411 of the housing 4 toward the inside of the housing 4. The connector terminal 21 is bolted to the bus bar 6 at the terminal block 3, whereby the connector (conductive member) 2 and the bus bar 6 are electrically connected to each other.

The terminal block 3 is a member serving as a base for electrically connecting the bus bar 6 connected to the power module 1 and the conductive member electrically connected to the electric component outside the power converter 100, and is made of a resin such as polyphenylene sulfide (PPS). The terminal block 3 is a polyhedron having an upper surface (first surface) 31, a lower surface (second surface) 32 facing the upper surface 31, and a side surface (connection surface) 33 connecting the upper surface 31 and the lower surface 32. The terminal block 3 is housed in the housing 4. Further, the terminal block 3 includes a flange 34 projecting from the side surface 33 to the outside of the terminal block 3. The flange 34 is fastened to the housing 4 via a bolt or the like on a projecting portion 44 of the housing 4, which will be described later, whereby the terminal block 3 is fixed to the housing 4.

Further, a floating nut (fastening member) 35 movable with respect to the terminal block 3 is provided on the lower surface 32 of the terminal block 3. The bus bar 6 and the connector terminal 21 of the connector 2 are electrically connected by being fastened via a bolt 36 fastened to the floating nut 35 on the lower surface 32 of the terminal block 3. Details of a fastening structure between the bus bar 6 and the connector terminal (conductive member) 21 will be described later.

The housing 4 is made of a metal material such as aluminum, and houses the power module 1, the terminal block 3, and the like. The housing 4 includes an upper wall (not shown), the side wall 41, a first bottom wall 42, and a second bottom wall 43 connecting the first bottom wall 42 and the side wall 41.

The power module 1 is mounted on the first bottom wall 42 of the housing 4. Further, the first bottom wall 42 includes the projecting portion 44 that projects upward and supports the terminal block 3. As described above, the flange 34 provided on the side surface 33 of the terminal block 3 is fastened to the projecting portion 44 via a bolt or the like. Further, the first bottom wall 42 includes a pedestal portion 45 on which the heat transfer sheet 5 to be described later is mounted. The pedestal portion 45 is formed to project upward at a position between a position where the power module 1 is mounted and a position where the terminal block 3 is housed, and has a mounting surface (upper surface) 451 on which the heat transfer sheet 5 is mounted. A water path 46 through which cooling water for cooling the power module 1 flows is formed below the position on the first bottom wall 42 where the power module 1 is mounted.

The connector 2 is provided on the side wall 41 of the housing 4 at a position near the lower surface 32 of the terminal block 3. The connector 2 is provided on an outer surface of the side wall 41, and the opening 411 through which connector terminals 21 of the connector 2 passes is formed at a position of the side wall 41 where the connector 2 is provided. The connector terminal 21 of the connector 2 projects to the inside of the housing 4 through the opening 411 and is connected to the bus bar 6 on the lower surface 32 of the terminal block 3.

The second bottom wall 43 of the housing 4 extends downward from a position on the first bottom wall 42 where the projecting portion 44 is formed, and is bent at a position lower than a portion where the bus bar 6 is connected to the connector terminal 21 and is connected to one end 412 of the side wall 41. Accordingly, the bus bar 6 on the lower surface 32 of the terminal block 3 and a lower portion of the connector terminal 21 are covered with the housing 4 (the second bottom wall 43 and the side wall 41).

The heat transfer sheet (cooling member) 5 is a member that transfers heat from the bus bar 6 to the housing 4, and is made of a silicon-based material having heat transfer and electrical insulating properties. The heat transfer sheet 5 is mounted on the mounting surface 451 on the pedestal portion 45 of the housing 4, and an upper surface 51 of the heat transfer sheet 5 is in contact with the bus bar 6. That is, the heat transfer sheet 5 is sandwiched between the pedestal portion 45 and the bus bar 6. Accordingly, the heat from the bus bar 6 escapes to the housing 4 via the heat transfer sheet 5, so that the heat from the bus bar 6 can be removed.

The bus bar 6 electrically connects the power module 1 and the conductive member (connector 2) connected to the electric component outside the power converter 100. The one end of the bus bar 6 is fastened to the power module 1 via a bolt or the like while being mounted on the connection terminal portion 11 of the power module 1. The other end of the bus bar 6 is bolted to the connector terminal 21 of the connector 2 on the lower surface 32 of the terminal block 3 by the floating nut (fastening member) 35 and the bolt 36 fastened to the floating nut (fastening member) 35.

Next, the fastening structure between the bus bar 6 and the connector terminal (conductive member) 21 will be described.

A recess 321 is provided on the lower surface 32 of the terminal block 3, and the floating nut (fastening member) 35 is fitted into the recess 321 movably with respect to the terminal block 3 in a vertical direction (a direction perpendicular to the lower surface 32). The bus bar 6 and the connector terminal 21 of the connector 2 are fastened together via the bolt 36 fastened to the floating nut 35, whereby the bus bar 6 and the connector terminal (conductive member) 21 are electrically connected to each other. Any known floating nut may be used as the floating nut 35. For example, a floating nut which includes a plate fitted into the recess 321 and a nut portion inside the plate and has a movement play between the nut portion and an inside of the plate and is used. Accordingly, the nut portion is movable with respect to the terminal block 3.

As described above, the bus bar 6 and the connector terminal (conductive member) 21 are fastened to each other by using the floating nut (fastening member) 35 movably provided on the terminal block 3, so that the terminal block 3 can be prevented from being applied with stress due to being pulled by the conductive member (high-power harness) including the connector terminal 21.

When the bus bar and the conductive member are fastened to each other via a fastening member movably provided on the terminal block, the stress applied to the terminal block can be relieved. However, the stress may be applied to the bus bar via the conductive member. When the stress is applied to the bus bar via the conductive member, the stress may be applied to a fastening point connecting the power module and the bus bar. In this regard, if a length of the bus bar is increased, the stress applied to the fastening point connecting the power module and the bus bar can be reduced, but a size of the power converter must be increased, which is not preferable from the viewpoint of space saving.

In addition, when the fastening member is movable with respect to the terminal block, a displacement (backlash) of the bus bar may increase. With an increase in output of electric vehicles and the like in recent years, a large current flows through the bus bar and heat is generated, and therefore, it is required to efficiently remove the heat from the bus bar. A heat transfer sheet (cooling member) is sandwiched between the bus bar and the housing to remove the heat from the bus bar, and the heat from the bus bar escapes to the housing via the heat transfer sheet. However, a desired heat transfer effect cannot be obtained from the heat transfer sheet unless the heat transfer sheet is compressed by a compression amount within a predetermined range (for example, 10% to 50%) due to its material properties. When the displacement of the bus bar is large, a position of the bus bar cannot be regulated, the heat transfer sheet may not be compressed by an appropriate compression amount (within a predetermined range), and the heat from the bus bar may not be efficiently removed.

Therefore, in the present embodiment, the bus bar 6 is formed between the power module 1 and the conductive member (connector terminal 21) so as to surround the upper surface 31, the side surface 33, and the lower surface 32 of the terminal block 3. That is, by forming the bus bar 6 to surround the terminal block 3, the length of the bus bar 6 is increased without increasing the size of the power converter 100. Accordingly, the stress applied to the fastening point between the power module 1 and the bus bar 6 is reduced.

Further, since the displacement of the bus bar 6 is reduced by forming the bus bar 6 to surround the terminal block 3, the position of the bus bar 6 can be controlled such that the bus bar 6 compresses the heat transfer sheet 5 by a compression amount within a predetermined range.

Details of a wiring position and position regulation of the bus bar 6 will be described below.

As shown in FIG. 1, the bus bar 6 is mounted on the connection terminal portion 11 of the power module 1 and the upper surface 31 of the terminal block 3. The one end of the bus bar 6 is fastened to the power module 1 via a bolt or the like while being mounted on the connection terminal portion 11 of the power module 1. As will be described later, the position of the bus bar 6 is regulated by a position regulating member on the upper surface 31 of the terminal block 3.

Further, the bus bar 6 is in contact with the upper surface 51 of the heat transfer sheet 5 located between the power module 1 and the terminal block 3. As described above, the heat transfer sheet 5 is mounted on the mounting surface (upper surface) 451 of the pedestal portion 45 of the housing 4, and is sandwiched between the bus bar 6 and the housing 4 (pedestal portion 45). Accordingly, the heat from the bus bar 6 escapes to the housing 4 via the heat transfer sheet 5.

The connection terminal portion 11 of the power module 1 and the upper surface 31 of the terminal block 3 have the same vertical distance (hereinafter, referred to as height) from the first bottom wall 42 of the housing 4, and are located above the mounting surface 451 of the pedestal portion 45. More specifically, the height of the connection terminal portion 11 of the power module 1 and the upper surface 31 of the terminal block 3 is adjusted such that the bus bar 6 mounted on the connection terminal portion 11 of the power module 1 and the upper surface 31 of the terminal block 3 passes through a position where the heat transfer sheet 5 is compressed by a compression amount within a predetermined range. In this way, the connection terminal portion 11 of the power module 1 and the upper surface 31 of the terminal block 3 are located above the mounting surface 451 of the pedestal portion 45 such that the bus bar 6 passes through the position where the heat transfer sheet 5 is compressed by a compression amount within a predetermined range. Accordingly, the heat from the bus bar 6 can be efficiently removed to the housing 4.

Further, the bus bar 6 is mounted on the upper surface (first surface) 31 of the terminal block 3, and passes over the side surface (connection surface) 33 of the terminal block 3 and the lower surface 32 of the terminal block 3. That is, the bus bar 6 is formed between the power module 1 and the connector (conductive member) 2 so as to surround the upper surface 31, the side surface 33, and the lower surface 32 of the terminal block 3. As described above, the bus bar 6 is connected to the connector terminal 21 by using the floating nut (fastening member) 35 provided on the lower surface 32 so as to be movable with respect to the terminal block 3.

As described above, since the bus bar 6 is formed to surround the terminal block 3, the length of the bus bar 6 is increased, for example, as compared with the case where the power module 1 and the connector terminal (conductive member) 21 are connected in a straight line. Therefore, even if stress is applied to the bus bar 6 from the connector terminal (conductive member) 21, the stress applied to the fastening point between the power module 1 and the bus bar 6 is reduced. Since the length of the bus bar 6 is increased by forming the bus bar 6 to surround the terminal block 3, it is not necessary to increase the size of the power converter 100 to extend the bus bar 6.

Further, since the bus bar 6 is formed to surround the terminal block 3, even when the bus bar 6 and the connector terminal 21 are fastened to each other by using the movable fastening member 35, the displacement (backlash) of the bus bar 6 is reduced as compared with the case where the bus bar 6 is formed in a straight line or the like. Therefore, it is possible to prevent the compression amount of the heat transfer sheet 5 compressed by the bus bar 6 from deviating from a predetermined range due to the displacement of the bus bar 6.

Figure 2A:
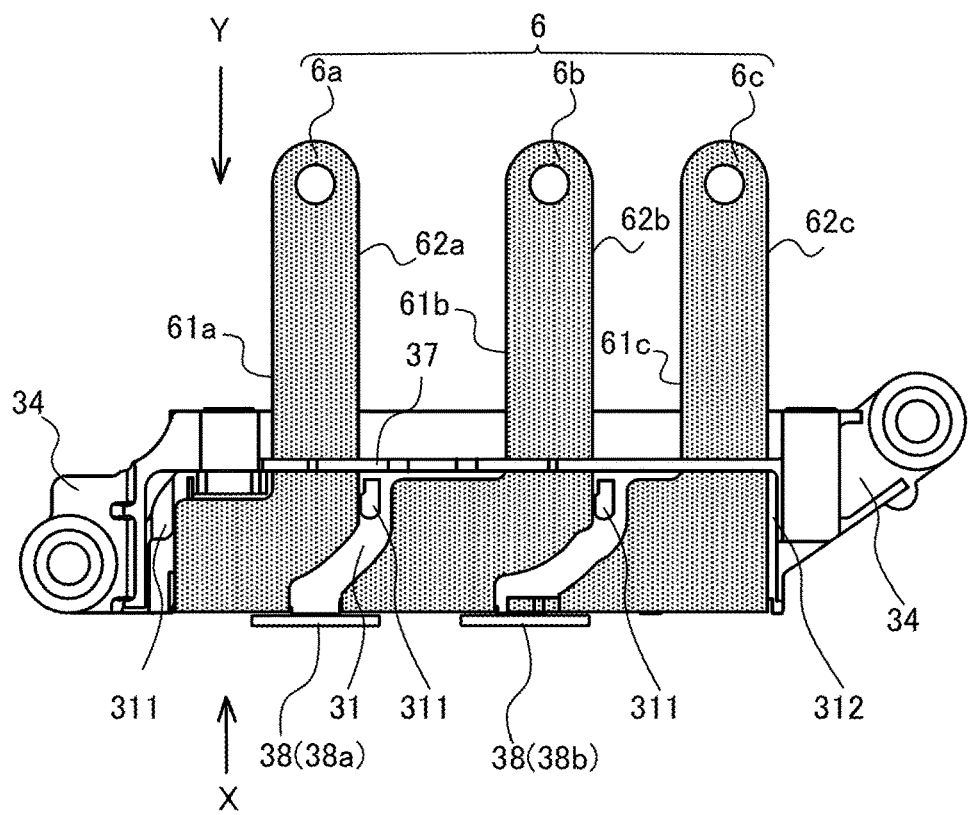
FIG. 2a is a plan view of a terminal block.
Figure 2B:
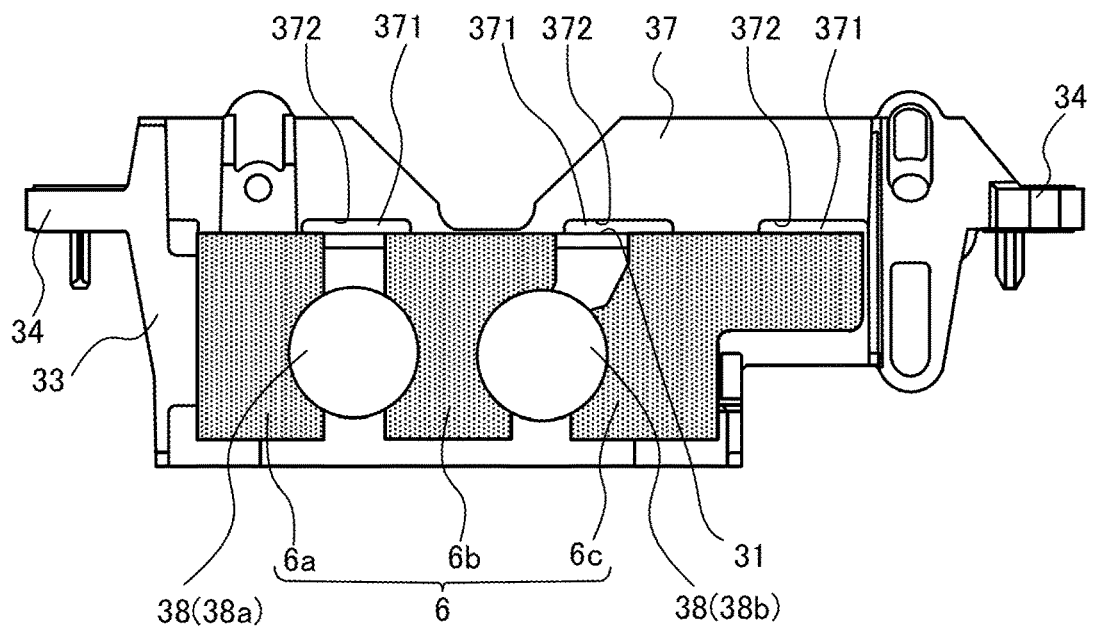
FIG. 2b is a rear view of the terminal block.
Figure 2C:
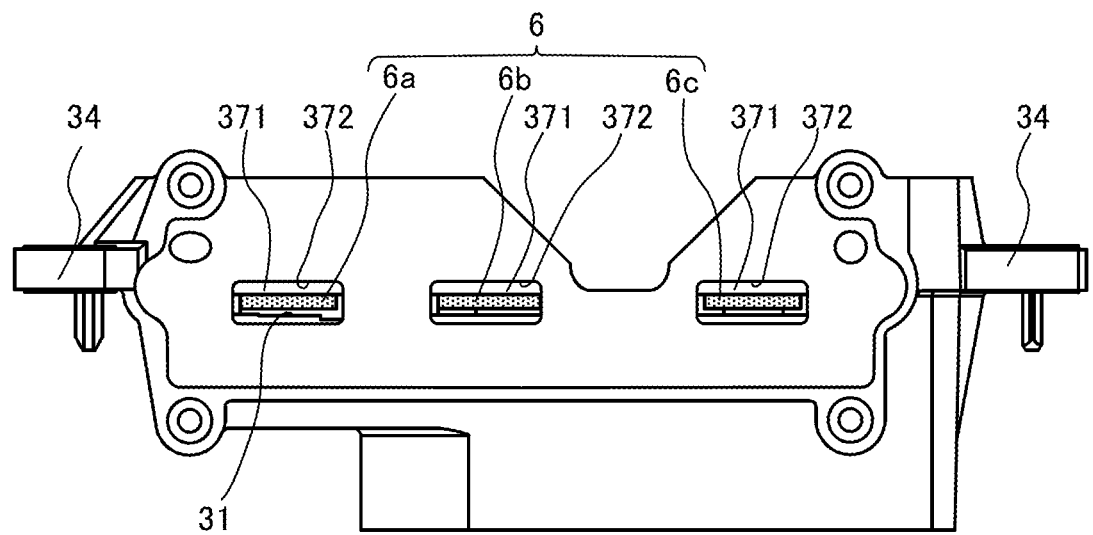
FIG. 2c is a front view of the terminal block.
Figure 2D:
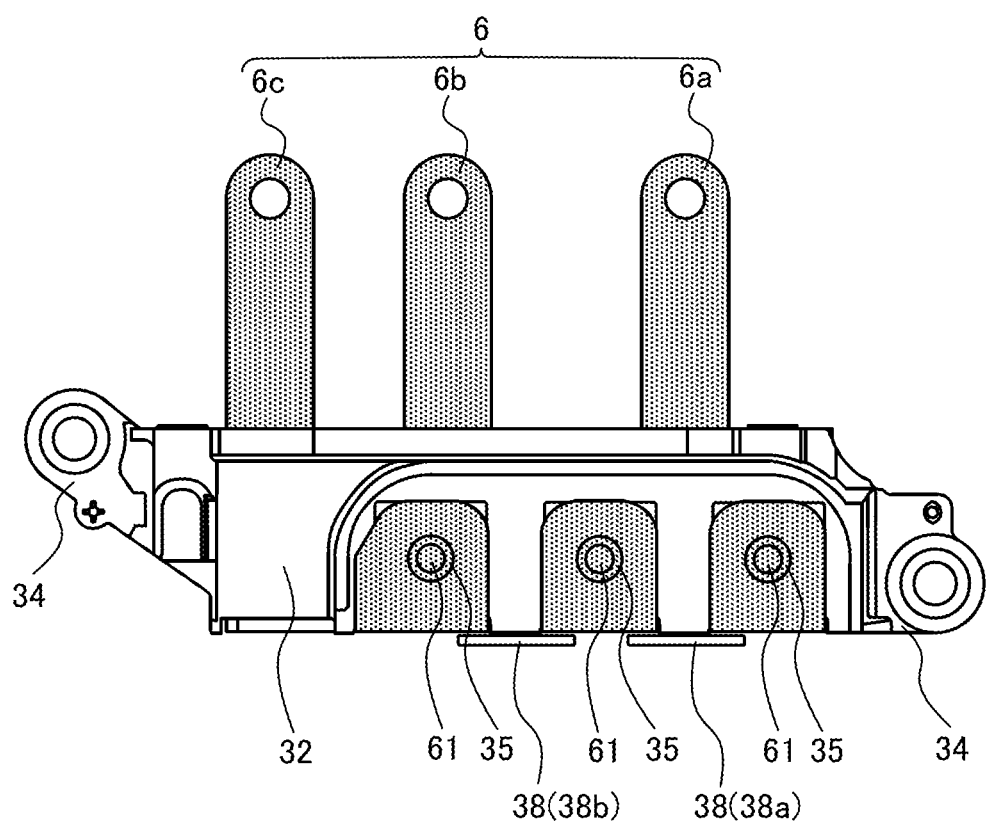
FIG. 2d is a bottom view of the terminal block.

FIG. 2a is a plan view of the terminal block 3. FIG. 2b is a rear view of the terminal block 3, which is a view of the terminal block 3 from an X direction in FIG. 2a. FIG. 2c is a front view of the terminal block 3, which is a view of the terminal block 3 from a Y direction in FIG. 2a. FIG. 2d is a bottom view of the terminal block 3.

As shown in FIGS. 2a to 2c, a plurality of bus bars 6 (for example, three bus bars 6a, 6b, 6c) are mounted on the upper surface 31 of the terminal block 3. An erected wall 37 erected from the upper surface 31 is formed on the upper surface 31 of the terminal block 3, and openings 371 whose number is equal to that of the bus bars 6 are formed on a lower portion of the erected wall 37. The openings 371 are holes for regulating the positions of the bus bars 6a, 6b, and 6c, and are surrounded by the upper surface 31 of the terminal block 3 and inner wall surface 372 of the erected wall 37 and penetrate in a surface direction of the upper surface 31. The bus bars 6a, 6b, and 6c are respectively inserted into the openings 371, and the position (displacement) of the bus bar 6 on the upper surface 31 is regulated by the inner wall surface 372 of the erected wall 37.

A height of the opening 371 from the upper surface 31 of the terminal block 3 (a length in a direction perpendicular to the upper surface 31) is slightly larger than a thickness of the bus bar 6 such that the bus bar 6 can move within a range in which the compression amount of the heat transfer sheet 5 does not deviate from a predetermined range.

FIG. 2d is a bottom view of the terminal block 3 showing a state before the bus bar 6 is bolted to the connector terminal 21. As described above, the floating nut 35 is movably fitted into the recess 321 on the lower surface 32 of the terminal block 3. As shown in FIG. 2d, a hole 61 through which the bolt 36 passes is formed at an end (the other end) of the bus bar 6 connected to the connector terminal 21 at a position corresponding to the floating nut 35. As shown in FIG. 1, the connector terminal 21 is arranged on the bus bar 6, and the bus bar 6 and the connector terminal 21 are fastened together via the bolt 36.

Further, as shown in FIG. 2b, clips (position regulating members) 38 made of a resin or the like are mounted on the side surface 33 of the terminal block 3 through which the bus bar 6 passes. The clips 38 are arranged between the bus bars 6 to straddle each two of the bus bars 6, and are fixed to the side surface 33 of the terminal block 3 with a part of each of the bus bars 6 sandwiched between the clips 38 and the side surface 33 of the terminal block 3. For example, a clip 38a between the bus bars 6a and 6b sandwiches a part of each of the bus bars 6a and 6b between the clip 38a and the side surface 33 of the terminal block 3, and a clip 38b between the bus bars 6b and 6c sandwiches a part of each of the bus bars 6b and 6c between the clip 38b and the side surface 33. Any known method may be used for fixing the clips 38. For example, each of the clips 38 is provided with a projecting portion projecting toward the terminal block 3, an insertion hole is provided at a position on the side surface 33 where the clip 38 is mounted, and the projecting portion is inserted into the insertion hole and fixed. In this way, by sandwiching the bus bar 6 between the clip 38 fixed to the side surface 33 of the terminal block 3 and the side surface 33, a position (displacement) of the bus bar 6 in a direction perpendicular to the side surface 33 of the terminal block 3 is regulated, and the bus bar 6 and the terminal block 3 have an integral structure. Accordingly, the bus bar 6 is prevented from being detached from the terminal block 3, and on the lower surface 32 of the terminal block 3, a position of the hole 61 of the bus bar 6 and a position of the floating nut 35 are prevented from being displaced from each other (the bus bar is prevented from covering the floating nut 35).

As shown in FIGS. 2a and 2d, a distance between the side surface 33 and the clip 38 is slightly larger than the thickness of the bus bar 6 at a position where the bus bar 6 is sandwiched between the side surface 33 of the terminal block 3 and the clip 38. Further, as described above, the opening 371 of the erected wall 37 erected on the upper surface 31 of the terminal block 3 has a length in an up-down direction slightly larger than the thickness of the bus bar 6. Therefore, the bus bar 6 is not completely fixed with respect to the surface direction of the side surface 33 (up-down direction of the housing 4), and maintains a certain degree of freedom of moving toward the side surface 33 in the surface direction (up-down direction of the housing 4).

As shown in FIG. 2a, the upper surface 31 of the terminal block 3 is formed with projecting portions 311 projecting upward (in the direction perpendicular to the upper surface 31) from the upper surface 31. The projecting portions 311 are provided to be located outside the side surface of the bus bars 6a, 6b, 6c, respectively, when the bus bars 6a, 6b, 6c are mounted on the upper surface 31. That is, the projecting portions 311 are provided to be located outside one side surface 61a of the bus bar 6a, between the other side surface 62a of the bus bar 6a and one side surface 61b of the bus bar 6b, and between the other side surface 62b of the bus bar 6b and one side surface 61c of the bus bar 6c, respectively. Accordingly, positions (displacements) of the bus bars 6a, 6b, and 6c in the surface direction on the upper surface 31 are regulated. The projecting portions 311 may be in contact with the bus bars 6a, 6b, 6c, or a slight gap may be formed between the projecting portions 311 and the bus bars 6a, 6b, 6c. Further, an edge portion 312 extending upward from the upper surface 31 is formed on an outer side of the other side surface 62c of the bus bar 6c, and an outward displacement of the other side surface 62c of the bus bar 6c is regulated by the edge portion 312.

Figure 2E:
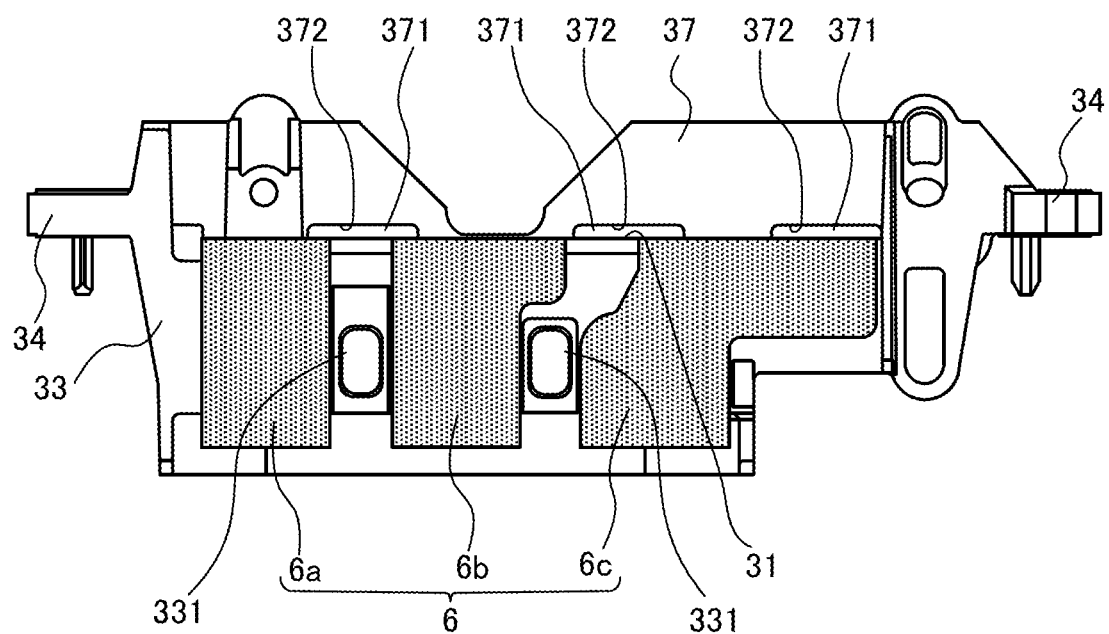
FIG. 2e is a rear view of the terminal block before a clip is mounted.

FIG. 2e is a rear view of the terminal block 3 in a state before the clips 38 are mounted, and is a view of the terminal block 3 as viewed from the X direction in FIG. 2a.

As shown in FIG. 2e, the side surface 33 of the terminal block 3 is also formed with projecting portions 331 projecting from the side surface 33 in the direction perpendicular to the side surface 33 (outward direction of the terminal block 3). The projecting portions 331 are provided on the side surface 33 of the terminal block 3 so as to be located outside side surfaces of the bus bars 6a, 6b, and 6c passing over the side surface 33. Accordingly, positions (displacements) of the bus bars 6a, 6b, and 6c in the surface direction on the side surface 33 of the terminal block 3 are regulated. The projecting portions 331 may be in contact with the bus bars 6a, 6b, 6c, or a slight gap may be formed between the projecting portions 331 and the bus bars 6a, 6b, 6c. The above-mentioned clips 38 are respectively provided on the projecting portions 331 formed between the bus bar 6a and the bus bar 6b and between the bus bar 6b and the bus bar 6c.

As described above, the position of the bus bar 6 on the terminal block 3 is regulated by the openings 371 of the erected wall 37 on the upper surface 31, the clips 38 on the side surface 33, the projecting portions 311 and 331 on the upper surface 31 and the side surface 33, and the like.

According to the power converter 100 of the embodiment described above, the following effects can be obtained.

According to the power converter 100, the bus bar 6 is formed between the power module 1 and the connector (conductive member) 2 so as to surround the upper surface (first surface) 31, the side surface (connection surface) 33, and the lower surface (second surface) 32 of the terminal block 3. Further, the bus bar 6 is connected to the connector (conductive member) 2 by using the floating nut (fastening member) 35 provided on the lower surface (second surface) 32 of the terminal block 3 so as to be movable with respect to the terminal block 3. As described above, since the bus bar 6 is formed to surround the terminal block 3, the length of the bus bar 6 is increased, and even when the stress is applied to the bus bar 6 from the connector (conductive member) 2, the stress applied to the fastening point between the power module 1 and the bus bar 6 is reduced. That is, by using the floating nut (fastening member) 35 that is movable with respect to the terminal block 3, it is possible to reduce the stress applied to the terminal block 3 and reduce the stress applied to the fastening point between the power module 1 and the bus bar 6.

Further, since the bus bar 6 is formed to surround the terminal block 3, the length of the bus bar 6 can be increased without increasing the size of the power converter 100. Therefore, it is possible to realize compactness of the power converter 100 and reduce the stress applied to the fastening point between the power module 1 and the bus bar 6.

Further, since the bus bar 6 is formed to surround the terminal block 3, even when the bus bar 6 and the connector (conductive member) 2 are fastened to each other by using the floating nut (fastening member) 35 movable with respect to the terminal block 3, the displacement (backlash) of the bus bar 6 is reduced. Therefore, alignment work of the bus bar 6 is facilitated.

According to the power converter 100, the bus bar 6 is formed between the power module 1 and the connector (conductive member) 2 so as to surround the upper surface (first surface) 31, the side surface (connection surface) 33, and the lower surface (second surface) 32 of the terminal block 3. The housing 4 includes the pedestal portion 45 located between the power module 1 and the terminal block 3, and the heat transfer sheet (cooling member) 5 that transfers heat from the bus bar 6 to the housing 4 is sandwiched between the bus bar 6 and the mounting surface (upper surface) 451 of the pedestal portion 45. The connection terminal portion 11 of the power module 1 and the upper surface (first surface) 31 of the terminal block 3 are located above the mounting surface (upper surface) 451 of the pedestal portion 45 such that the bus bar 6 mounted on the connection terminal portion 11 and the upper surface (first surface) 31 passes through the position where the heat transfer sheet (cooling member) 5 is compressed by a compression amount within a predetermined range. In this way, the height of the connection terminal portion 11 of the power module 1 and the upper surface 31 of the terminal block 3 is adjusted such that the bus bar 6 passes through the position where the heat transfer sheet 5 is compressed by a compression amount within a predetermined range. Therefore, the heat from the bus bar 6 can be efficiently removed to the housing 4.

Further, since the bus bar 6 is formed to surround the terminal block 3, the displacement (backlash) of the bus bar 6 is reduced. Accordingly, it is possible to prevent the compression amount of the heat transfer sheet 5 compressed by the bus bar 6 from deviating from a predetermined range due to the displacement of the bus bar 6.

According to the power converter 100, the clip (position regulating member) 38 fixed on the side surface (connection surface) 33 of the terminal block 3 is provided, and the bus bar 6 is sandwiched between the side surface (connection surface) 33 of the terminal block 3 and the clip (position regulating member) 38. In this way, the position (displacement) of the bus bar 6 in the direction perpendicular to the side surface (connection surface) 33 of the terminal block 3 is regulated, and the bus bar 6 and the terminal block 3 can have an integral structure. Therefore, it is possible to prevent the bus bar 6 from being detached from the terminal block 3 and to prevent the bus bar from covering the floating nut (fastening member) 35.

According to the power converter 100, the projecting portions 311 and 331 are provided on the upper surface (first surface) 31 and the side surface (connection surface) 33 of the terminal block 3. Accordingly, the positions (displacements) of the bus bar 6 in the surface direction on the upper surface (first surface) 31 and the side surface (connection surface) 33 of the terminal block 3 are further regulated. Therefore, the displacement (backlash) of the bus bar 6 is further reduced, and it is possible to further prevent the compression amount of the heat transfer sheet 5 compressed by the bus bar 6 from deviating from a predetermined range due to the displacement of the bus bar 6.

According to the power converter 100, the terminal block 3 has the erected wall 37 erected from above the upper surface (first surface) 31 of the terminal block 3. Further, the erected wall 37 has the opening 371 that regulates the position of the bus bar 6 on the upper surface (first surface) 31, and the bus bar 6 is inserted into the opening 371. Accordingly, the position (displacement) of the bus bar 6 on the upper surface (first surface) 31 is further regulated, and it is possible to further prevent the compression amount of the heat transfer sheet 5 compressed by the bus bar 6 from deviating from a predetermined range due to the displacement of the bus bar 6.

In the present embodiment, the side surface 33 of the terminal block 3 includes the flange 34, and the terminal block 3 is fixed to the housing 4 by fastening the flange 34 to the projecting portion 44 of the housing 4. The method for fixing the terminal block 3 to the housing 4 is not limited to this, and any known method may be used.

The terminal block 3 may have any shape as long as the terminal block 3 includes a first surface, a second surface facing the first surface, and a connection surface connecting the first surface and the second surface, and may have, for example, a cylindrical shape.

In the present embodiment, the housing 4 includes the upper wall, the side wall 41, the first bottom wall 42, and the second bottom wall 43, but the shape of the housing 4 is not limited to this, and may have any shape as long as the housing 4 includes a portion on which the power module 1 is mounted and the pedestal portion 45 on which the heat transfer sheet (cooling member) 5 is mounted.

A mounting direction of the housing 4 can be optionally determined. For example, the housing 4 may be mounted such that the bottom walls 42 and 43 are turned upside down in FIG. 1, or the housing 4 may be mounted at an angle.

In the present embodiment, the bus bar 6 and the connector terminal 21 are fastened to each other by using the floating nut 35, but the present invention is not necessarily limited to this. As long as the fastening member has a structure that is movable with respect to the terminal block 3 and can reduce the stress applied to the terminal block 3, any known structure may be used for the fastening member for fastening the bus bar 6 and the connector terminal 21.

In the present embodiment, the height of the connection terminal portion 11 of the power module 1 is equal to the height of the upper surface 31 of the terminal block 3, but the present invention is not necessarily limited to this. That is, the connection terminal portion 11 of the power module 1 and the upper surface 31 of the terminal block 3 do not necessarily have to have the same height as long as the bus bar 6 can be mounted to pass through the position where the bus bar 6 compresses the heat transfer sheet 5 by a compression amount within a predetermined range.

In the present embodiment, the number of the bus bars 6 mounted on the terminal block 3 is set to 3, but the number of the bus bars 6 is not limited to this.

In order to regulate the position of the bus bar 6 on the terminal block 3, it is preferable to provide the terminal block 3 with the erected wall 37, the clip 38, and the projecting portions 311 and 331 as in the present embodiment, but these members are not essential configurations, and other existing members that regulate the position of the bus bar 6 may be used. Further, as long as the position of the bus bar 6 on the terminal block 3 can be regulated, the erected wall 37, the clip 38 and the projecting portions 311 and 331 can be set to any number and can be mounted at any position, and the number and the mounting position are not limited to those described in the present embodiment.

Although the embodiment of the present invention has been described above, the above-mentioned embodiment is only a part of application examples of the present invention, and is not intended to limit the technical scope of the present invention to the specific configuration of the above-mentioned embodiment.

The invention claimed is:

1. A power converter, comprising:
   a power module;
   a terminal block;
   a housing that houses the power module and the terminal block; and
   a bus bar that electrically connects the power module and a conductive member connected to an electric component outside the housing, wherein
   the terminal block is a member that electrically connects the bus bar and the conductive member, has a first surface, a second surface facing the first surface, and a connection surface that connects the first surface and the second surface, and includes a fastening member provided on the second surface to be movable with respect to the terminal block, and
   the bus bar is formed between the power module and the conductive member to surround the first surface, the connection surface, and the second surface of the terminal block, and is connected to the conductive member on the second surface via the fastening member.

2. The power converter according to claim 1, wherein
   the housing includes a pedestal portion located between the power module and the terminal block,
   a cooling member that transfers heat from the bus bar to the housing is sandwiched between the bus bar and an upper surface of the pedestal portion,
   the power module includes a connection terminal portion for connecting the bus bar with the bus bar mounted thereon,
   the bus bar is mounted on the first surface of the terminal block, and
   the connection terminal portion of the power module and the first surface of the terminal block are located above the upper surface of the pedestal portion such that the bus bar mounted on the connection terminal portion and the first surface passes through a position where the cooling member on the pedestal portion is compressed by a compression amount within a predetermined range.

3. The power converter according to claim 1, further comprising:
a position regulating member that is fixed on the connection surface of the terminal block, wherein
by sandwiching the bus bar between the connection surface of the terminal block and the position regulating member, a position of the bus bar in a direction perpendicular to the connection surface is regulated.

4. The power converter according to claim 1, wherein
the first surface and the connection surface of the terminal block are provided with projecting portions that regulate positions of the bus bar on the first surface and on the connection surface in a surface direction.

5. The power converter according to claim 1, wherein
the terminal block has an erected wall erected from the first surface,
the erected wall has an opening that regulates the position of the bus bar on the first surface, and
the bus bar is inserted into the opening.

* * * * *